(12) United States Patent
Steffan et al.

(10) Patent No.: US 6,174,738 B1
(45) Date of Patent: Jan. 16, 2001

(54) CRITICAL AREA COST DISPOSITION FEEDBACK SYSTEM

(75) Inventors: Paul J. Steffan, Elk Grove; Ming Chun Chen, Milpitas, both of CA (US)

(73) Assignee: Advanced Micro Devices, Inc., Sunnyvale, CA (US)

(*) Notice: Under 35 U.S.C. 154(b), the term of this patent shall be extended for 0 days.

(21) Appl. No.: 08/979,630

(22) Filed: Nov. 28, 1997

(51) Int. Cl.[7] ................................... G01R 31/26

(52) U.S. Cl. .................................. 438/5; 438/14

(58) Field of Search ........................... 438/5, 14

(56) References Cited

U.S. PATENT DOCUMENTS

| | | | |
|---|---|---|---|
| 5,946,543 | * | 7/2000 | Kimura et al. ............... 438/14 |
| 6,090,632 | * | 7/2000 | Jeon et al. .................. 438/14 |

FOREIGN PATENT DOCUMENTS

| | | | | |
|---|---|---|---|---|
| P09-143910 | * | 6/1997 | (JP) ..................... H01L/21/66 |
| 97 66130 | * | 12/1997 | (KR) ..................... G01R/31/26 |

OTHER PUBLICATIONS

Gary Griffith Quality Technician's Handbook J. Wiley and Sons pp. 346, 348, 1986.*
Douglas C Montgomery Statistical Quality Control J. Wiley and Sons p. 15, Aug. 1, 1996.*

* cited by examiner

Primary Examiner—Charles Bowers
Assistant Examiner—David S Blum
(74) Attorney, Agent, or Firm—H. Donald Nelson

(57) ABSTRACT

A method of determining an accurate disposition decision for each inspected layer in a wafer lot wherein a measured defect density is compared to a calculated disposition criterion determined for each inspected layer. If the measured defect density is above the calculated disposition criterion the wafer lot is placed on hold and if the measured defect density is at or below the calculated disposition criterion the wafer lot is sent to the next process. The disposition criterion for each layer is determined from a yield value determined for each layer. The yield value is the yield necessary for each layer to obtain a profitable product and is determined from cost data for each die in the wafer lot and a risk factor determined by management and includes market data such as selling price and demand for the product. The yield value is combined with defect sensitivity determined for each layer. The defect sensitivity is determined from the combination of critical area and historical frequency for each layer.

7 Claims, 4 Drawing Sheets

CRITICAL AREA COST DISPOSITION FEEDBACK SYSTEM

BACKGROUND OF THE INVENTION

1. Field of the Invention

This invention relates generally to the manufacture of high performance semiconductor devices. More specifically, this invention relates to the determination of disposition criteria utilized in the determination of whether a particular lot is to be advanced to the next process. Even more specifically, this invention relates to the determination of disposition criteria utilized in the determination of whether a particular lot is to be advanced to the next process using a critical area cost disposition feedback system.

2. Discussion of the Related Art

Production costs for manufacturing state-of-the-art semiconductor wafers are increasing rapidly, devices are becoming larger and more dense, process technologies are becoming more complex with cycle times extending, and selling prices for the end products are extremely volatile. Due to the complex interaction of these and other variables, the decision making process for discrepant material in-line is becoming increasingly difficult. Presently there is no methodology for a decision to be made based upon an analytical rational basis.

The manufacturing of semiconductor wafers takes place in "lots" of wafers. A lot may include any selected number of wafers. Because it is virtually impossible to test each and every wafer in a lot, one or more wafers are selected as representative of the condition of the lot. For example, if a selected wafer indicates that the yield for the lot may be lower than a required minimum yield, the entire lot is placed on hold. The cause of the low yield can be determined, a remedial action may be taken, or the entire lot may be scrapped. As can be appreciated, the scrapping of a lot or lots of semiconductor wafers is very expensive and may be the difference between a profitable year and a disastrous year. When the selected wafer indicates that the yield will be extremely low or non-existent, the decision is simple. However, can there be a case when a defect density determination for a particular layer indicates that the yield will be 70%, 80% or even 95% or higher for that process step and a decision to continue processing the lot may be unprofitable. The answer, of course, depends partly upon which process step is involved and whether the particular process step is one in which an expected low yield for that step is unavoidable and the preceding and remaining process steps have high yields to compensate for the low yield. The criticality of minute changes in yields for a particular process step can be illustrated as follows. If there are 100 process steps and yield determinations are made at 50 of the process steps and show that at each process step there is yield of 99%, this would indicate that an overall yield of approximately 60% (calculated as follows: 0.99$^{50}$) would be achieved. On the other hand, if it is determined that there is only a yield of 95% for each layer, the overall yield would only be approximately 8%. This is a very simple illustration and indicates the extreme criticality of determining not only the yield of the particular layer, but realizing the effect of a yield determination on the overall yield. The person making the decision whether to move the lot to the next process step should have current data including the cost of each succeeding process step and the selling price of the end product. As can be appreciated, a yield of 30% for some products is an acceptable yield and results in a profitable process whereas for other parts, a yield of 80% may just be the breakeven point. An incorrect decision, either to continue processing the lot resulting in an unprofitable run or to scrap a lot that would have been profitable, can result in lost profits for the manufacturing company.

Tools currently exist that monitor the defect density of a wafer at a particular process step and tools exist, or are being created, that predict device yield based upon a concept called "critical area." The current concept of "critical area" is defect size and layer layout dependent. The critical area provides an estimate of killer propensity for killer type defects found within the layout area such that a killer defect found within the layout area will have a certain aptitude to disrupt the pattern to make the part non-functional. However, the current concept of critical area does not include a feedback system to consider the cost of each process step and the current selling price of the completed product.

Therefore, what is needed is a tool that is able to gather together all the necessary up-to-date information, including cost information, and provide a disposition based on available current and past data concerning a wafer lot on hold.

SUMMARY OF THE INVENTION

A Critical Area Cost Disposition Feedback System in accordance with the present invention solves the above and other problems associated with the current decision making process concerning the disposition of discrepant wafer lots placed on hold in a wafer manufacturing process.

The above and other objects and advantages of the present invention are attained through a system that provides the capability to gather information from diverse sources. Such sources include a wafer layout tool (such as a CAD tool), a wafer lever parametrics database (such as WORKSTREAM), a defect server (such as a Defect Management System tool). The system of the present invention manipulates the collected data to provide information to the decision making process whether or not a wafer lot on hold because of a particular defect density should be scrapped or released at the current location.

The present invention is attained through a system of determining an accurate disposition decision for each inspected layer in a wafer lot wherein a measured defect density is compared to a calculated disposition criterion determined for each inspected layer. If the measured defect density is above the calculated disposition criterion the wafer lot is placed on hold and if the measured defect density is at or below the calculated disposition criterion the wafer lot is sent to the next process. The disposition criterion for each layer is determined from a yield value determined for each layer. The yield value is the yield necessary for each layer to obtain a profitable product and is determined from cost data for each die in the wafer lot and a risk factor determined by management and includes market data such as selling price and demand for the product. The yield value is combined with defect sensitivity determined for each layer. The defect sensitivity is determined from the combination of critical area and historical frequency for each layer.

The present invention is better understood upon consideration of the detailed description below, in conjunction with the accompanying drawings. As will become readily apparent to those skilled in the art from the following description, there is shown and described an embodiment of this invention simply by way of illustration of the best mode to carry out the invention. As will be realized, the invention is capable of other embodiments and its several details are capable of modifications in various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to specific embodiments of the present invention which illustrate the best mode presently contemplated by the inventors for practicing the invention.

Figure 1:
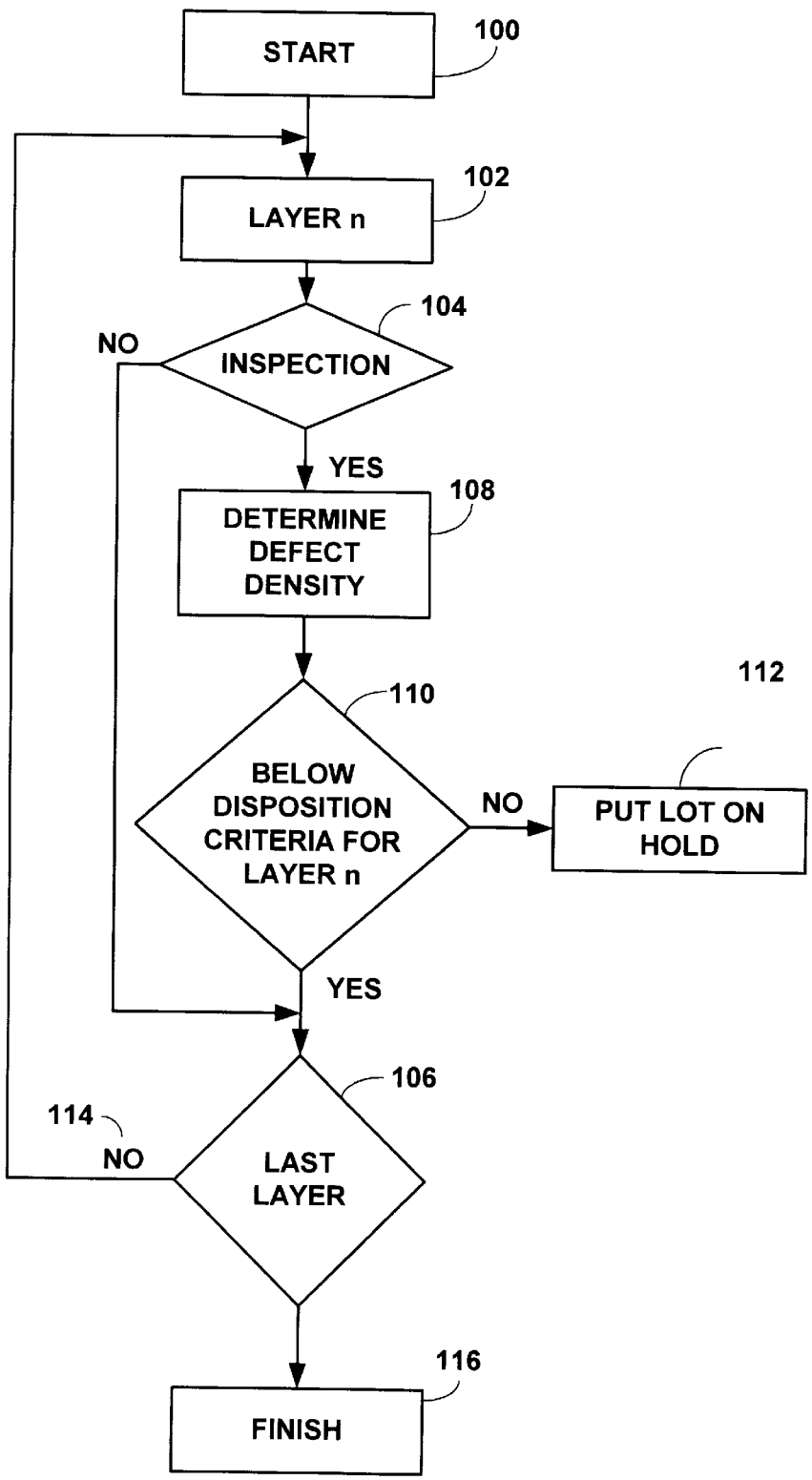
FIG. 1 is a flow diagram showing the flow of a wafer lot through a manufacturing process.

FIG. 1 is a flow diagram showing the flow of a wafer lot through a manufacturing process. It should be noted that the wafer lot includes an arbitrary number of wafers determined by factors such as tool capacity and throughput. In the discussion below, when speaking of a wafer it should be understood that all the wafers are involved unless specifically stated otherwise. The start of the manufacturing process is indicated at 100 and the wafers are subjected to a first process that provides layer 1, denoted in FIG. 1 as Layer n at 102 where n=1. The next step at 104 determines if the process step is a process step that is to be inspected. It is noted that not all layers are subjected to an inspection. If the process step is not to be inspected the process flow goes to a determination if the layer is the last layer, indicated at 106. If the process step is to be inspected, selected wafers are inspected to determine the defect density at 108. Once the defect density is determined, it is determined at 110 whether the defect density determined at 108 is below the disposition criteria established for layer n. If the defect density is above the established disposition criteria, the lot is put on hold as indicated at 112. If the defect density is below the established disposition criteria, a determination is made at 106 if the last layer or process has been performed, if not, the lot is sent to the next process, as indicated at 114. If the last layer or process has been performed, the lot is considered finished, as indicated at 116.

Figure 2:
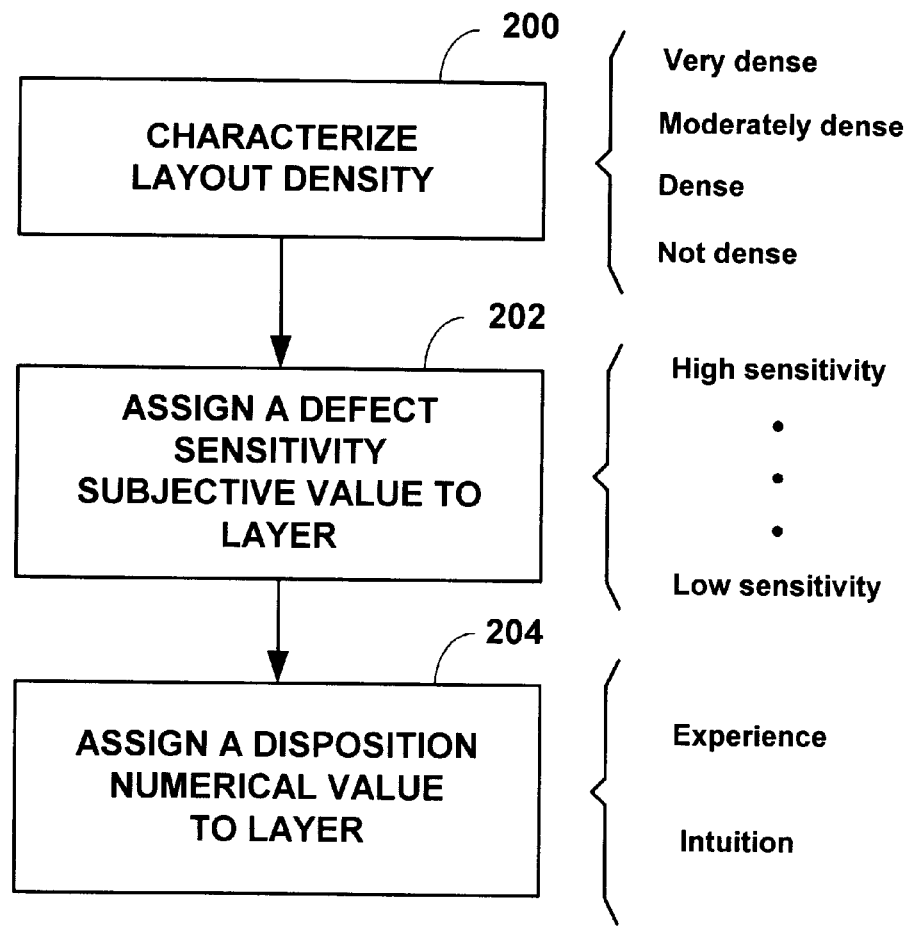
FIG. 2 is flow diagram of the process involved in assigning a numerical disposition value to a layer.

FIG. 2 illustrates the current process in which the disposition criteria is established for a particular layer or process. The first step, as indicated at 200, is to characterize the layout density for a particular layer. The next step, as indicated at 202, is to subjectively assign a defect sensitivity value to the layer. The characterization of the layout density can range from very dense, moderately dense, dense, to not dense. This assignment of a characterization is presently a subjective assignment made by a person with some experience and skill in the art. However, since the characterization is a subjective assignment, the characterization will vary from person to person and subject to error. The next step is to subjectively assign a layer defect sensitivity value to the particular layer. This assignment is based upon the characterization of the layout density. The person assigning the value may assign a "high sensitivity" to a very dense layout and a "low sensitivity" to a "not dense" layout density. The assignment of a defect sensitivity value to the complete range of layout densities becomes problematic. Once a defect sensitivity value has been assigned to a particular layer, the next step, indicated at 204, is to assign a numerical disposition value to the particular layer. This disposition value may range from a low value of 0.2 defects/cm$^2$ to a value of 10 defects/cm$^2$. These values are given as examples only. The disposition value is used as follows: when a particular layer is inspected and the measured defect density is below the assigned disposition value for that particular layer, the lot is automatically passed to the next process. If the measured defect density is above the assigned disposition value for that particular layer, the lot is put on hold and may be scrapped. Because a wafer lot may involve a large number of wafers and an even larger number of individual dice, the decision to place a lot on hold or to scrap a lot based upon whether a measured defect density is above or below a disposition value that has been determined by only subjective methods may be the source of unwarranted loss of profits. Alternatively, the decision to allow a lot to continue to the next process based upon the same subjectively based disposition value may also be the source of unwarranted loss of profits if, in fact, the lot should have been put on hold and/or scrapped.

Figure 3:
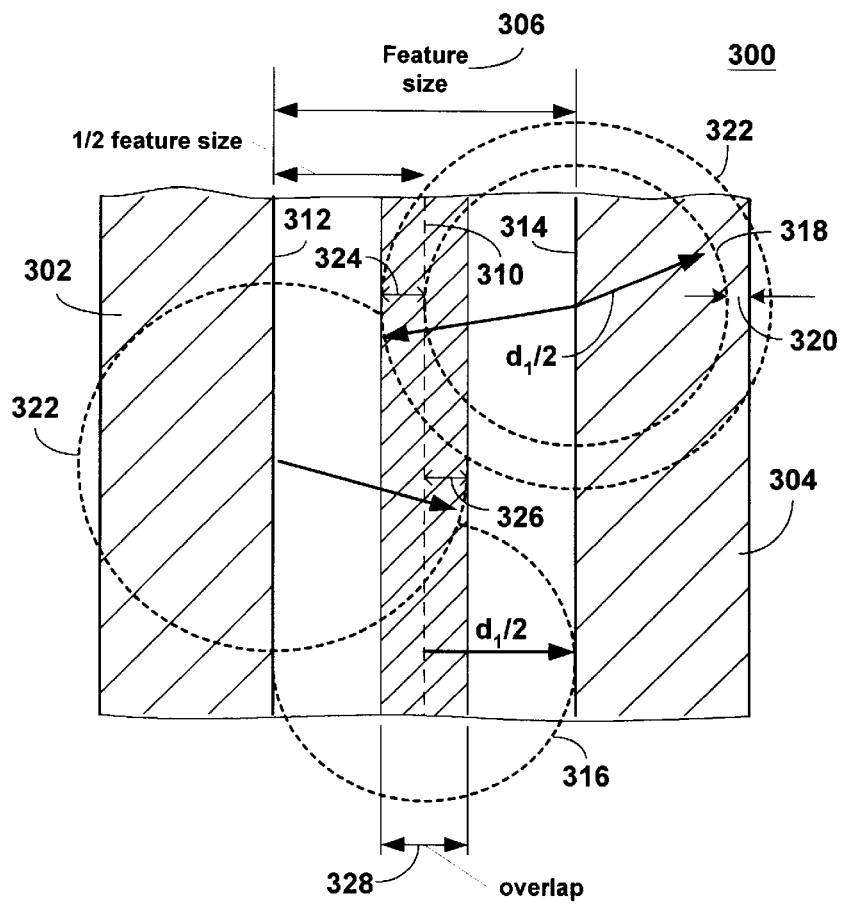
FIG. 3 is a diagram showing the derivation of the quantity a/A where a=critical area and A=total area of the die.

FIGS. 3–6 illustrate graphically the method of determining a disposition criteria value for each layer in a semiconductor manufacturing process in accordance with the present invention. FIG. 3 shows a portion 300 of a semiconductor die. The portion 300 of the semiconductor die is utilized to illustrate the derivation of the value a/A where a=critical area and A=total area of the die. The portion 300 shows a portion 302 of a first metal line and a portion of a second metal line 304. A minimum distance called the feature size, indicated at 306, separates the metal lines. The feature size 306 is dictated by limitations inherent in the process that is used to manufacture the semiconductor die. The overlap, indicated at 328, is a function of the size d of defects and is derived as follows. The dashed line 310 is the centerline between the boundaries 312 and 314 of the metal lines 302 and 304, respectively. The dashed circle represents various sized defects. The defect 316 has the same size as the feature size 306. The defect 316 has the potential to bridge the gap between the metal line 302 and 304 and thus has the potential to be a "killer" defect, that is, a defect that will cause the die to fail. The radius $d_1/2$ of the defect 316 is ½ the feature size where $d_1$=the feature size. The defect 318 is also a defect that has the same size as the feature size with a radius=$d_1/2$. However, as shown the defect 318 will not be a killer defect because there is a portion 320 of the metal line 304 that will provide electrical continuity and thus the die will not show as a failed part, at least initially. As the defect size increases as shown at 322 the defect 322 has the potential to cut the metal line 304 and to extend beyond the centerline 310 as shown at 324. Similarly, the defect 322 is shown over metal line 302 and has the potential to cut the metal line 302 and extend beyond the centerline 310 as shown at 326. The extensions shown, at 324 and 326, combine to form the overlap 328. A value of "a" is calculated for each defect size by multiplying the overlap by the combined length of the structures in the die that have an overlap for each size defect.

Figure 4:
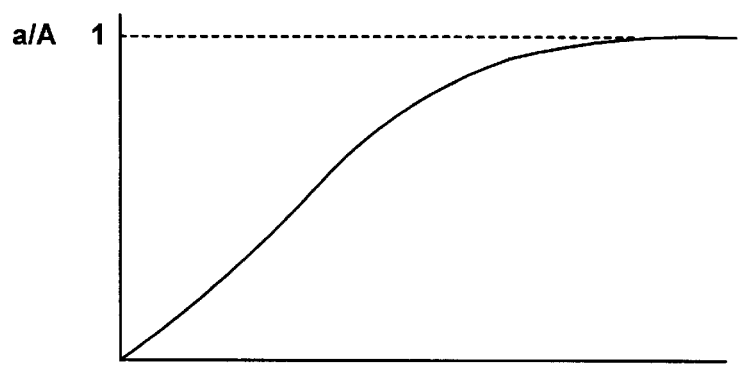
FIG. 4 is a diagram showing the value a/A as a function of d where d=defect size.

FIG. 4 is a graphical representation of the values a/A plotted as a function of d, where a=the critical area and is derived as discussed above, A=the total area of the die and d=the defect size.

Figure 5:
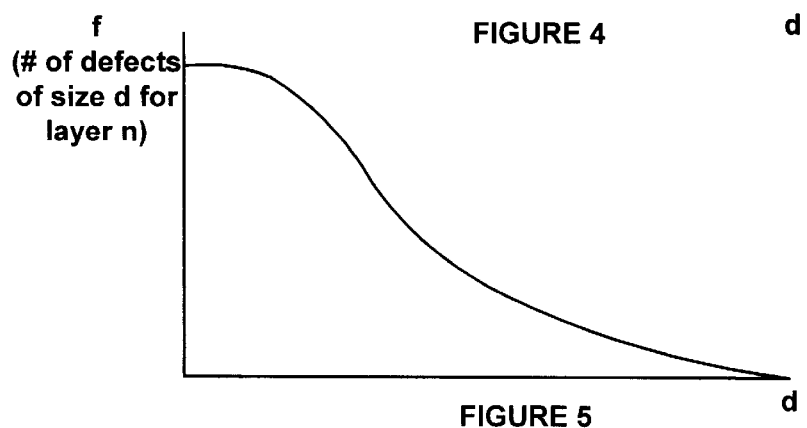
FIG. 5 is a diagram showing the value f as a function of d where f=number of defects of size d for layer n.

FIG. 5 is a graphical representation of the frequency f of the number of defects of size d found in layer n. This graphical representation is obtained from a historical database collected from the same type wafers.

Figure 6:
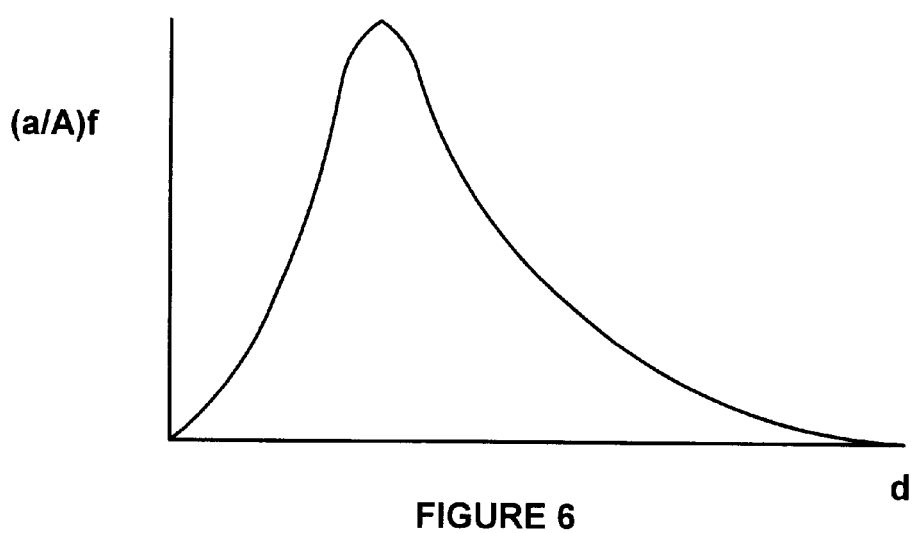
FIG. 6 is a diagram showing the value (a/A)f as a function of d.

FIG. 6 is a graphical representation of (a/A)f as a function of d; defect size. The integral, ∫ (a/A)f(d) from limits 0 to ∞, of the curve shown in FIG. 6, is a numerical value and is the sensitivity a of the layer n to defects and is also known as the layer layout sensitivity.

The yield at a particular layer that must be achieved to have a profitable product is defined as:

$Y_n = e^{-\alpha A (disposition\ criteria)}$, where $\alpha$ is the value calculated above, A is the total area of the die and the "disposition criteria" is a value that must be calculated. The method of calculating the disposition criteria is to determine the value of Y including cost information for each layer and solve for the value of the disposition criteria. The calculated value of $Y_n$ that includes cost information is calculated as follows:

$Y_n$=1−((accumulated cost for a die in layer n)/(total cost for a die))(risk factor). The accumulated cost for a die in layer n is the total cost to manufacture a single die in all layers up to and including layer n. The total cost for a die is the total cost to manufacture a single die in all layers. The risk factor is a factor determined by management and includes factors such as the current price at which the die is selling, opportunity costs such as the use of the manufacturing line that could be used to manufacture other die, etc. The risk fact is continuously update to reflect current data including the current market data.

Table 1 is an example of the data that could be used to determine the values of $Y_n$. It is to be understood that the values in Table 1 are arbitrary and are used to illustrate the method of determining Y.

TABLE 1

| (1) Layer (n) | (2) Manufacturing cost of layer n | (3) Accumulated cost of layer n (accum. col. (2) | (4) Total cost | (5) risk factor | $Y_n$ |
| --- | --- | --- | --- | --- | --- |
| 1 | $5 | $5 | $32 | .32 | 95%* |
| 2 | $10 | $15 | $32 | .32 | 85% |
| 3 | $7 | $22 | $32 | .32 | 78% |

*The calculation for this value is as follows:
$Y_1$ = 1 − (5/32)(.32) = .95 → 95% yield for $Y_1$. This means that for the simple example shown above the minimum yield for layer n = 1 is 95%. By extension, the minimum yield for layer n = 2 is 85%. If the yield is below the calculated yield, the part will be unprofitable or at least will not meet the criteria represented by the risk factor set by the management of the manufacturing company.

$Y_1$=1−(5/32)(0.32)=0.95→95% yield for $Y_1$. This means that for the simple example shown above that the minimum yield for layer n=1 is 95%. By extension, the minimum yield for layer n=2 is 85%. If the yield is below the calculated yield, the part will be unprofitable or at the least will not meet the criteria represented by the risk factor set by the management of the manufacturing company.

The individual values of $Y_n$ are then used to calculate the individual disposition criteria by solving the equation:

$Y_n = e^{-\alpha A (disposition\ criteria)}$ for each value of disposition criteria.

The calculated value for the disposition criteria is then used by the person making the decision to continue processing or to put a wafer lot on hold by comparing the calculated disposition criteria value to the measured defect density. If the measured defect density is above the calculated disposition criteria, the wafer lot is put on hold. If the measured defect density is below the calculated disposition criteria, the wafer lot is allowed to continue to the next step in the manufacturing process for that wafer.

Figure 7:
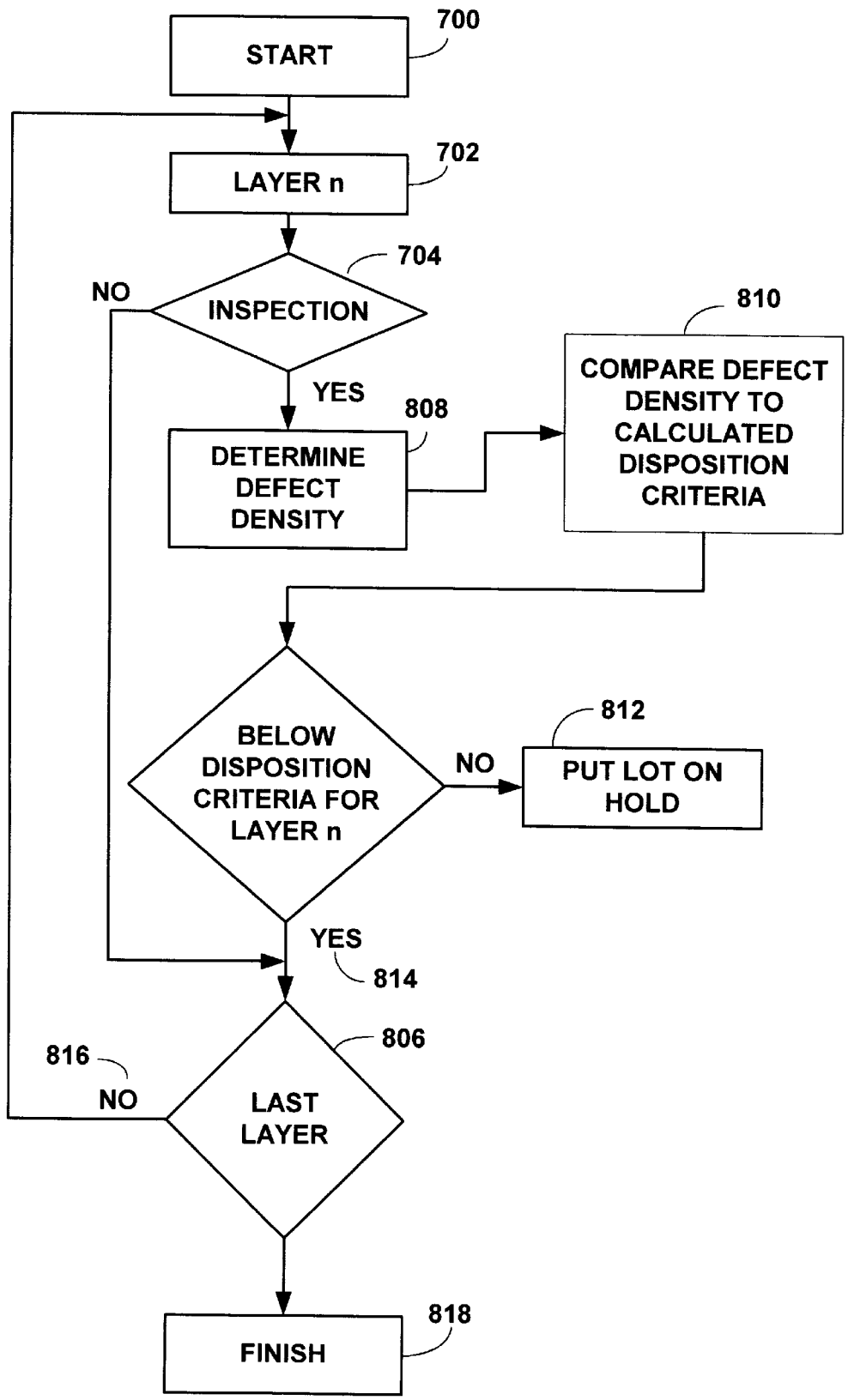
FIG. 7 is a flow diagram showing the flow of a wafer lot through a manufacturing process in accordance with the present invention.

FIG. 7 is a flow diagram showing the flow of a wafer lot through a manufacturing process in accordance with the present invention. The start of the manufacturing process is indicated at 700 and the wafers are subjected to a first process that provides layer 1, at 702 where n=1. The next step at 704 determines if the process step is a process step that is to be inspected. If the process step is not to be inspected the process flow goes to a determination if the layer is the last layer, indicated at 806. If the process is to be inspected, selected wafers are inspected to determine the defect density at 808. Once the defect density is determined, the measured defect density is compared at 810 to a calculated disposition criterion for that layer. If the measured defect density is above the calculated disposition criterion for that layer the wafer lot is placed on hold as indicated at 812. If the measured defect density is at or below the calculated disposition the wafer lot is passed to the next step in the process as indicated at 814. If the process is not the last layer, the wafer lot is sent to the next step in the process, as indicated at 816. If the process is the last layer, the wafer lot is finished the manufacturing process, as indicated at 818.

The foregoing description of the embodiment of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A method of determining an accurate disposition decision for each inspected layer of a wafer selected from a wafer lot in a semiconductor manufacturing process, the method comprising:

(a) determining a defect density f in a layer n of the wafer selected from a wafer lot;

(b) determining a ratio a/A wherein a is calculated for each defect size by multiplying an overlap value by the combined length of structures in a die that have an overlap value for each size defect and wherein A is the total area of the die;

(c) determining a value $\alpha$ by integrating (a/A)f∫(d) as a function of d, the size of defects in layer n, from 0 to infinity where $\alpha$ is the layer layout sensitivity;

(d) determining a yield value $Y_n$ for layer n from the relationship:

1−((accumulated cost for a die in layer n)/total cost of die))risk factor;

(e) calculating a disposition criterion from the equation:

$$Y_n = e^{-\alpha A(\text{disposition criterion})};$$

(f) comparing the defect density in layer n with the calculated disposition criterion for layer n;

(g) placing the wafer lot on hold if the defect density in layer n is above the calculated disposition criterion for layer n; and (h) sending the wafer lot to the next process if the defect density in layer n is at or below the calculated disposition criterion for layer n.

2. The method of claim 1 wherein the step (j) of determining a defect sensitivity from a critical area determination and a frequency f of defect density for each layer n, comprises:

(l) combining the critical area value and the frequency of defect density to obtain a relationship based on defect size; and (m) integrating the resulting relationship to obtain a single value.

3. The method of claim 2, wherein the step of combining the critical area value and the frequency of defect density, comprises determining the frequency of defect density for each layer from historical data for similar wafer lots.

4. The method of claim 3 wherein determining a yield value for each layer n including a risk factor including cost data for die from the wafer lot is accomplished by continuously updating the cost data and determining a new yield value for each layer based upon the continuously updated cost data.

5. The method of claim 4 wherein the cost data used to update the yield value for each layer n includes:

cost data for manufacturing each die in the wafer lot; and total cost data for manufacturing each die in the wafer lot.

6. The method of claim 5 wherein the step of determining a yield value for each layer n including a risk factor including market data for die from the wafer lot includes continuously updating the yield value for each layer n with data from the market such as price and demand.

7. The method of claim 1 wherein step (f) is accomplished by:

(i) determining a yield value $Y_n$ for layer n including a risk factor that includes the current price at which the die is selling and opportunity costs;

(j) determining a defect sensitivity from a critical area determination for each layer n and a frequency f of defect density for each layer n; and (k) determining the disposition criterion value for each layer n from the yield value $Y_n$ and the defect sensitivity for each layer n.

* * * * *